(12) United States Patent
Park

(10) Patent No.: US 7,977,789 B2
(45) Date of Patent: Jul. 12, 2011

(54) BUMP WITH MULTIPLE VIAS FOR SEMICONDUCTOR PACKAGE AND FABRICATION METHOD THEREOF, AND SEMICONDUCTOR PACKAGE UTILIZING THE SAME

(75) Inventor: Yun Mook Park, Cheongju-Si (KR)

(73) Assignee: Nepes Corporation, Gak-Ri, Ochang-Myun, Cheongwon-Gun, Chungbuk (KR)

( * ) Notice: Subject to any disclaimer, the term of this patent is extended or adjusted under 35 U.S.C. 154(b) by 316 days.

(21) Appl. No.: 12/095,668

(22) PCT Filed: Aug. 28, 2006

(86) PCT No.: PCT/KR2006/003386
§ 371 (c)(1),
(2), (4) Date: Jun. 9, 2008

(87) PCT Pub. No.: WO2007/064073
PCT Pub. Date: Jun. 7, 2007

(65) Prior Publication Data
US 2009/0283903 A1    Nov. 19, 2009

(30) Foreign Application Priority Data

Dec. 2, 2005 (KR) .................. 10-2005-0117239
Jun. 27, 2006 (KR) .................. 10-2006-0058266

(51) Int. Cl.
*H01L 23/488* (2006.01)
(52) U.S. Cl. ............ 257/737; 257/738; 257/E21.509; 257/E23.023

(58) Field of Classification Search .......... 257/737, 257/738, E23.021, E23.069, E21.508
See application file for complete search history.

(56) References Cited

U.S. PATENT DOCUMENTS

| 5,739,587 A | 4/1998 | Sato |
| 6,717,263 B2 | 4/2004 | Sawai et al. |
| 7,253,519 B2 * | 8/2007 | Huang et al. .......... 257/738 |
| 2004/0007779 A1 * | 1/2004 | Arbuthnot et al. ...... 257/780 |
| 2006/0125110 A1 * | 6/2006 | Do et al. ................ 257/778 |
| 2007/0001301 A1 * | 1/2007 | Wang ..................... 257/734 |
| 2007/0020906 A1 * | 1/2007 | Chiu et al. .............. 438/597 |
| 2007/0075423 A1 * | 4/2007 | Ke et al. ................. 257/737 |

FOREIGN PATENT DOCUMENTS

| JP | 2000311913 | 11/2000 |
| JP | 2004363319 | 12/2004 |
| KR | 20000065487 | 11/2000 |

* cited by examiner

*Primary Examiner* — N Drew Richards
*Assistant Examiner* — Mamadou Diallo

(57) ABSTRACT

A bump for a semiconductor package forms a polymer layer having multiple vias on an electrode pad above a semiconductor chip to increase an electrical contact area between the electrode pad and a metal bump. Further, the bump forms a polymer layer having multiple vias on a redistribution electrode pad to increase a surface area of an electrode interconnection. The multiple vias increase electrical and mechanical contact areas, thereby preventing current crowding and improving joint reliability. The bump for a semiconductor package may further comprise a stress relaxation layer at the lower portion of the bump.

19 Claims, 7 Drawing Sheets

FIG. 4    (PRIOR ART)
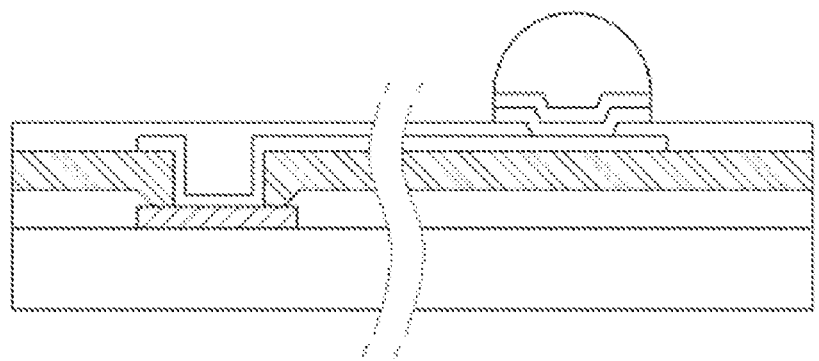
FIG. 5
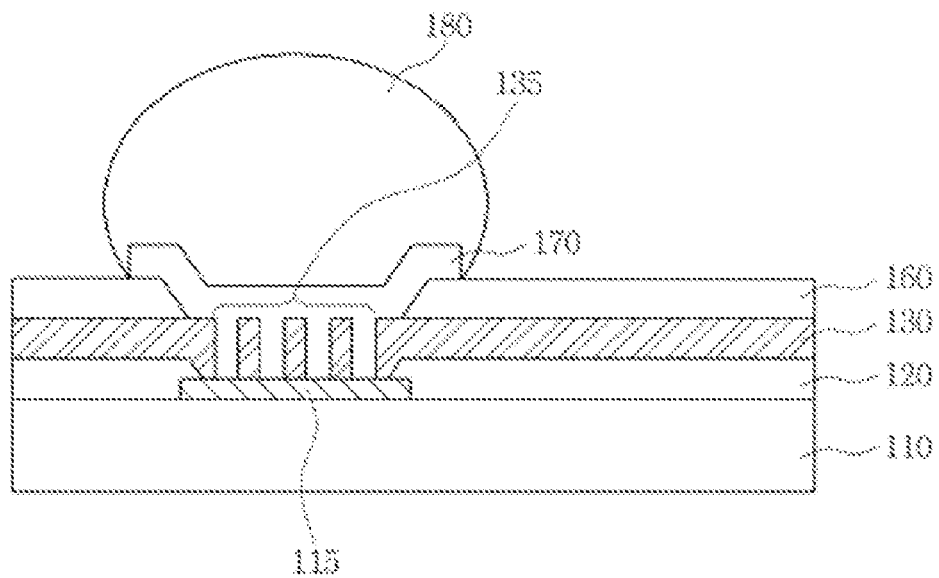
FIG. 6
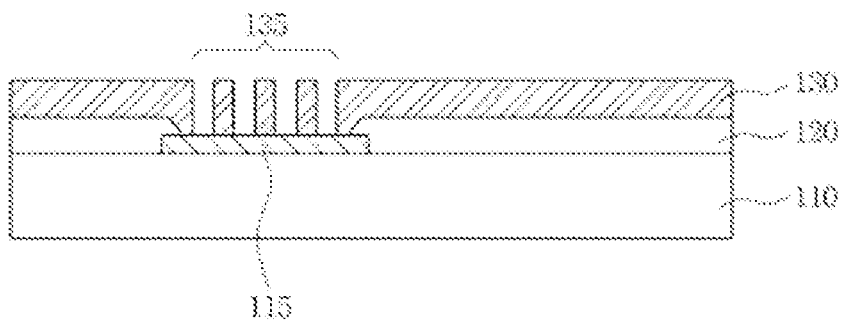

BUMP WITH MULTIPLE VIAS FOR SEMICONDUCTOR PACKAGE AND FABRICATION METHOD THEREOF, AND SEMICONDUCTOR PACKAGE UTILIZING THE SAME

FIELD OF THE INVENTION

The present inventions are directed to a bump for a semiconductor package, more particularly a bump with multiple vias and a method of fabricating the same.

BACKGROUND OF THE INVENTION

With high integration density, high performance and high-speed operation of semiconductor chips, much effort has been attempted to downsize and mass-produce semiconductor packages. For example, the semiconductor package has been proposed, which directly and electrically connects pads of a semiconductor chip and electrode terminals of a printed circuit board through bumps, which are made of solder or metal and formed on the pads of the semiconductor chip.

A typical semiconductor package using the bump which is made of solder may be a flip chip ball grid array (FCBGA) package or a wafer level chip scale package (WLCSP). Meanwhile, a package using the bump which is made of metal may be a chip-on-glass (COG) package or a tape carrier package (TCP).

The FCBGA package may be fabricated by electrically connecting solder bumps coming in contact with pads of a semiconductor chip to pads of a substrate, performing underfill to protect the solder bumps from external environment or mechanical problems, attaching solder balls on the rear of the substrate which comes in contact with the semiconductor chip, and electrically connecting the solder bumps with the electrode terminals of a printed circuit board. Meanwhile, the method of fabricating the WLCSP redistributes or reconfigures electrode pads to provide light, thin, short and small products, and equalizes the sizes of a chip and a package through metal bumps.

The chip-on-glass method manufactures the semiconductor package by forming metal bumps on pads of a semiconductor chip, and electrically connecting the pads of the semiconductor chip to electrode terminals of a printed circuit board by thermal compression and hardening through medium composed of polymer containing anisotropic conductive particles.

FIGS. 1 through 4 partially illustrate a redistribution process and a bumping process in the WLCSP method.

As illustrated in FIG. 1, an electrode pad 15 is formed on a substrate 10, and an insulating layer 20 exposes the top surface of the electrode pad 15. To redistribute the electrode pad, a polymer layer 30 with an opening is formed on the top surface of the electrode pad. An area of the electrode pad 15 extended for the redistribution is illustrated in a plan view of FIG. 2.

As illustrated in FIG. 3, a metal bump structure for a semiconductor package comprises a passivation layer 20 selectively exposing a chip pad above a semiconductor chip 10, a polymer layer 30 reconfiguring the chip pad, a metal interconnection 40 forming the pad and redistributed on the polymer layer 30, a polymer layer 50 protecting the redistributed metal interconnection, UBMs 60 and 70 formed on the redistributed pad, and a metal bump 80 formed on the UBMs 60 and 70. FIG. 4 illustrates the electrode pad portion of FIG. 1 and the bump portion of FIG. 3 on the whole.

As semiconductor chips are being made with high integration density and high performance, a driving current increases. As operating speed of the semiconductor chip increases, its operation frequency increases as well. However, the tendency creates many problems in the redistribution/metal bump structure of a conventional wafer level chip size/scale package. For example, an interface crack occurs due to the atomic migration and electromigration at the interface between the UBM and the metal bump at high current/high frequency. Furthermore, as the chips are downsized, and the operation frequency gets higher, signal delay and distortion are worse.

Therefore, the present invention has been made in view of the above-mentioned problems, and it is an objective of the present invention to improve electrical properties of a wafer level chip scale package (WLCSP) operating at high frequency and high current.

It is another objective of the present invention to reduce an interface crack caused by atomic migration and electromigration at the interface between an UBM (under bump metallurgy) and a metal bump.

It is yet another objective of the present invention to provide a bump for a semiconductor package capable of increasing a contact area between an electrode pad and a metal bump, thereby to improve contact reliability.

It is yet still another objective of the present invention to increase resistance against thermal stress of a mounted semiconductor package, thereby to improve mechanical reliability.

According to an exemplary embodiment of the present invention, there is provided a bump for a semiconductor package, which comprises an electrode pad formed above a semiconductor chip, a polymer layer formed on the electrode pad and having a plurality of vias, an UBM formed on the polymer layer having the plurality of vias, and a metal bump bonded on the UBM According to another exemplary embodiment of the present invention, there is provided a bump for a semiconductor package, which comprises an electrode pad redistributed above a semiconductor chip, a polymer layer formed on the electrode pad and having a plurality of vias, an UBM formed on the polymer layer having the plurality of vias, and a metal bump bonded on the UBM. The redistributed electrode pad may be one redistributed from the electrode pad of a first region. In this case, a polymer layer having a plurality of vias may be formed on the electrode pad located at the first region.

According to another exemplary embodiment of the present invention, there is provided a bump for a semiconductor package, which comprises an electrode pad and/or a redistribution electrode pad formed above a semiconductor chip, a polymer layer formed on the electrode pad and/or the redistribution electrode pad and having a plurality of vias, a stress relaxation layer formed above the polymer layer having the plurality of vias, an UBM formed on the polymer layer having the plurality of vias, and a metal bump bonded on the UBM.

The metal bump may be composed of at least one selected from the group consisting of gold, gold alloy, copper, copper alloy, nickel, nickel alloy, aluminum, aluminum alloy, silver, silver alloy, eutectic solder (Sn/37Pb), high lead solder (Sn/95Pb), and lead-free solder having Sn of 30% or more (SnAg, SnCu, SnZn, SnZnBi, SnAgCu, SnAgBi, SnAgCuNi, and the like).

The electrode pad of the semiconductor chip may be composed of at least one selected from the group consisting of titanium, titanium alloy, aluminum, aluminum alloy, nickel, nickel alloy, copper, copper alloy, chromium, chromium alloy, gold, gold alloy, silver, silver alloy, and lead-free solder containing tin (Sn).

The UBM may have a structure of three layers including an adhesion layer having excellent adhesive strength with the electrode pad or the redistribution electrode pad, a diffusion-barrier layer preventing diffusion from the metal bump to the electrode pad, and a wetting layer having excellent wettability with the metal bump. Alternatively, the UBM may have a structure of two layers (the adhesion layer and the diffusion-barrier layer, the adhesion layer and the wetting layer, the diffusion-barrier layer and the wetting layer).

The adhesion layer may be composed of at least one selected from the group consisting of titanium, titanium alloy, chromium, chromium alloy, copper, copper alloy, nickel, nickel alloy, gold, gold alloy, aluminum, aluminum alloy, vanadium, and vanadium alloy.

The diffusion-barrier layer may be composed of at least one selected from the group consisting of nickel, nickel alloy, copper, copper alloy, vanadium, and vanadium alloy, aluminum, aluminum alloy, gold, gold alloy, cobalt, cobalt alloy, manganese, and manganese alloy.

The wetting layer may be composed of at least one selected from the group consisting of copper, copper alloy, nickel, nickel alloy, gold, gold alloy, aluminum, aluminum alloy, cobalt, cobalt alloy, manganese, manganese alloy, and lead-free solder containing tin (Sn) of 30% or more.

The adhesion layer may have a thickness of about 0.01 μm to about 1 μm, and the diffusion-barrier layer may have a thickness of about 1 μm to about 10 μm, and the wetting layer may have a thickness of about 1 μm to about 10 μm, and the UBM may have a thickness of about 0.1 μm to about 100 μm.

The metal bump may be formed inside and outside the vias of the polymer layer.

The polymer layer may be photosensitive and composed of at least one selected from an organic substance including polyimide, benzocyclobutene (BCB), epoxy resin, and siloxane or silicone resin, an inorganic substance including $SiO_2$ and SiN, and a mixture of the organic and inorganic substances.

The polymer layer having the plurality of vias may comprise an insulating material having a dielectric constant of 1.0 or more. The via of the polymer layer may have a circular shape, or any one selected from a polygonal shape such as a quadrangular shape, a pentagonal shape, a hexagonal shape, and an octagonal shape. The polymer layer having the plurality of vias may have a thickness of about 0.1 μm to about 100 μm, and a ratio of thickness to opening width of about 0.5 or more.

A total area of the plurality of vias of the polymer layer may be 10% or more compared to that of the electrode pad, and a total surface area of the vias may be 50% or more compared to that of the electrode pad.

In accordance with another aspect of the present invention, there is provided a method of fabricating a bump for a semiconductor package. The method comprises the steps of forming a polymer layer having a plurality of vias on an electrode pad above a semiconductor chip, forming an UBM on the polymer layer, and forming a metal bump on the UBM.

The method may further comprise the step of forming a stress relaxation layer formed above the polymer layer having the plurality of vias. Further, the method may further comprise the step of redistributing the electrode pad.

The polymer layer having the plurality of vias may be formed using any one selected from coating, immersion, dry film deposition, chemical vapor deposition (CVD), physical vapor deposition (PVD), and evaporation.

The UBM may be formed using any one selected from PVD, CVD, evaporation, electroplating, electroless plating, and screen printing.

The metal bump may be formed using any one selected from electroplating, electroless plating, evaporation, ball attach, ball placement, screen printing, and solder jet.

The present invention also provides a semiconductor package including the bump.

According to the present invention, a polymer layer having a number vias is formed on an electrode pad or a redistribution electrode pad formed above a semiconductor chip, thereby increasing an electrical surface area and a physical contact area between the electrode pad and a metal bump. Since current crowding is prevented and current dispersion occurs by the plurality of vias, current density between the electrode pad and the metal bump decreases. Accordingly, occurrence of the interface crack caused by a joule heating effect and atomic migration/electromigration which occur at the metal bump having a fine pitch is suppressed, thereby to increase a lifetime of the package. Further, a contact area between the electrode pad and the metal bump increases, thereby to improve joint reliability.

In addition, since the polymer layer for relieving stress is formed below the metal bump, although stress generated by a thermal expansion coefficient difference between a substrate and a semiconductor chip after device mounting is concentrated to the metal bump, the polymer layer serves to relieve the stress, thereby to improve mechanical reliability of the package.

DESCRIPTION OF DRAWINGS

FIG. 4 is a schematic sectional view illustrating the structures of FIGS. 1A and 1C in whole;

FIG. 5 is a sectional view illustrating a bump structure according to a first embodiment of the present invention;

FIG. 6 is a sectional view illustrating a redistributed structure of an electrode according to a second embodiment of the present invention;

DETAILED DESCRIPTION

Figure 1:
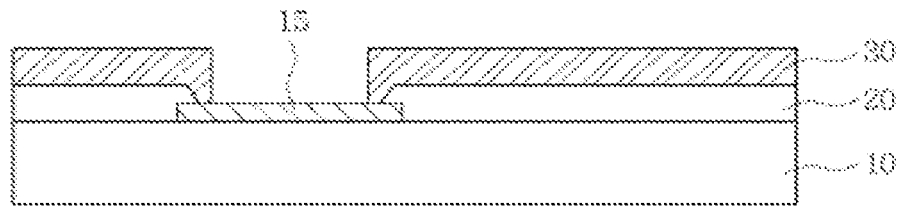
FIG. 1 is a sectional view illustrating a redistributed structure of a conventional electrode.
Figure 2:
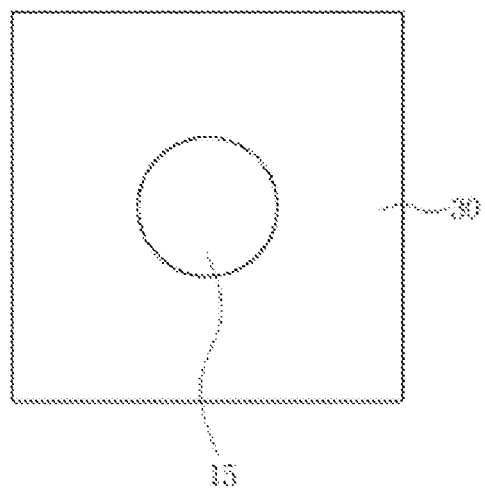
FIG. 2 is a plan view illustrating an area of the electrode of FIG. 1A.
Figure 3:
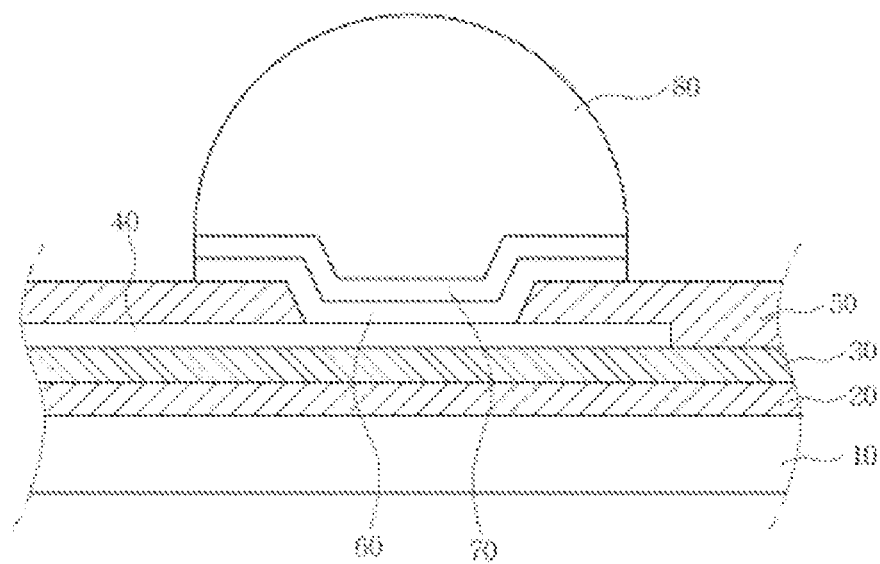
FIG. 3 is a sectional view illustrating a structure of a conventional bump.

Hereinafter, a bump for a semiconductor package, a method of fabricating the bump, and a semiconductor package using the bump will be described in greater detail with reference to the accompanying drawings.

FIG. 5 is a sectional view illustrating a bump structure according to a first embodiment of the present invention. As illustrated in FIG. 5, a substrate 110 including semiconductor devices is formed thereon with an electrode pad 115, the top surface of which is exposed by an insulating layer 120. The electrode pad 115 having the exposed top surface is formed thereon with a polymer layer 130. The polymer layer 130 includes a plurality of vias 135 on a region of the electrode pad 115. The vias 135 increase the surface area of an electrode while electrically contacting an UBM 170. Thus, current crowding is prevented, and current dispersion occurs, thereby improving the electrical properties of a semiconductor package. The top surface of the polymer layer 130 is formed thereon with another polymer layer 160 in order to relieve stress. The polymer layer 160 is exposed around the vias, and the exposed region of the polymer layer 160 is formed thereon with the UBM 170 and a metal bump 180.

FIG. 6 is a sectional view illustrating a redistributed structure of an electrode according to a second embodiment of the present invention. A substrate 110 including semiconductor devices is formed thereon with at least one electrode pad 115, the top surface of which is exposed by an insulating layer 120. The electrode pad 115 having the exposed top surface is formed thereon with a polymer layer 130. The polymer layer 130 includes a plurality of vias 135 on a region of the electrode pad 115.

Figure 7:
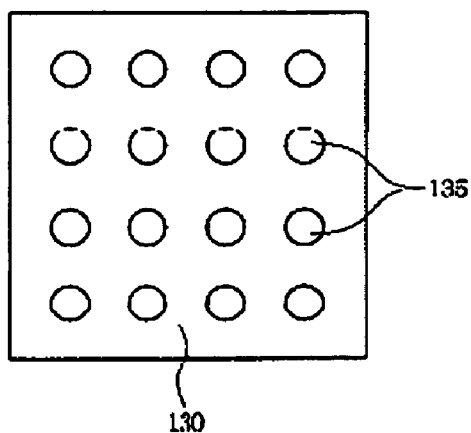
FIG. 7 is a plan view illustrating a structure of a polymer layer including a plurality of vias according to an embodiment of the present invention.
Figure 8:
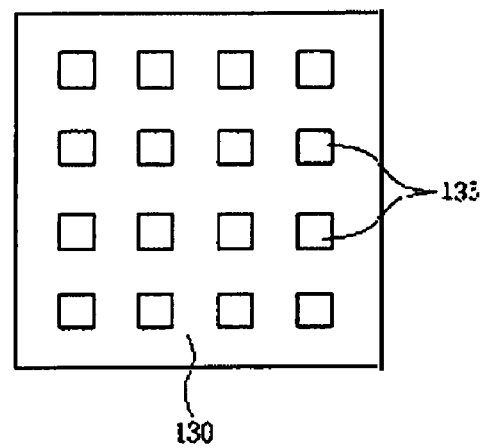
FIG. 8 is a plan view illustrating a structure of another polymer layer including a plurality of vias according to an embodiment of the present invention.

FIGS. 7 and 8 illustrate an example of a structure of a polymer layer 130 including a plurality of vias 135. Each via 135 may have various shapes such as a circular shape and a polygonal shape including a quadrangular shape. These vias 135 increase the surface area of a redistribution electrode (140 of FIG. 9), which extends from the electrode pad 115 and is redistributed. For example, when an electrode pad is formed to have one via having a radius of about 40 μm, and another electrode pad is formed to have 16 vias, each having a radius of about 10 μm, the surface area of the latter electrode increases about twice that of the former one.

Figure 9:
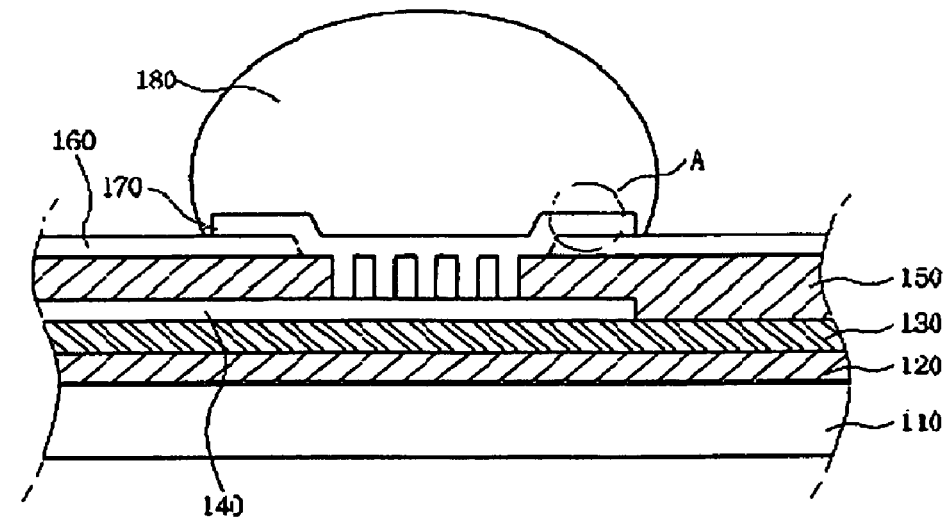
FIG. 9 is a sectional view illustrating a bump structure according to a second embodiment of the present invention.
Figure 11:
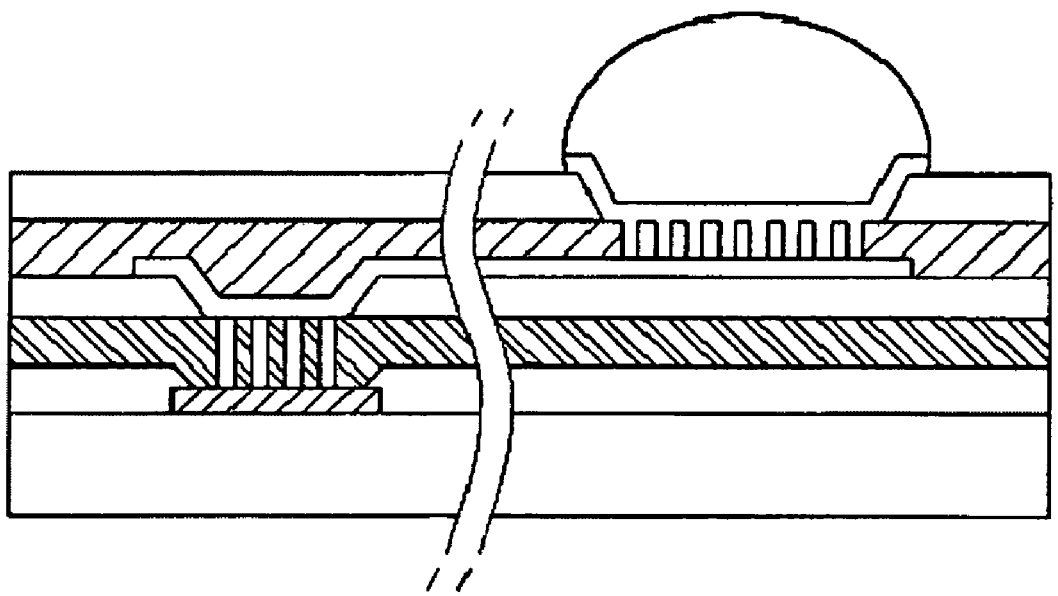
FIG. 11 is a schematic sectional view illustrating the structures of FIGS. 6 and 9 in whole.

FIG. 9 illustrates an electrode portion redistributed from the electrode pad 115 of FIG. 6. The electrode portion comprises an insulating layer 120 as a passivation layer on a semiconductor substrate 110, a first polymer layer 130 including a plurality of vias increasing the surface area of the electrode pad, an electrode pad redistribution electrode layer 140, a second polymer layer 150 including a plurality of vias increasing the surface area of a metal bump 180, a third polymer layer 160 releasing stress, an UBM 170 extending to the vias and over the second polymer layer 150 around the vias, and the metal bump 180 formed on the UBM 170. FIG. 11 is a schematic sectional view illustrating the structures of FIGS. 6 and 9 in whole.

Since the redistribution electrode layer 140, the UBM 170, and the metal bump 180 are electrically connected through the plurality of vias, current is dispersed, and an interface crack caused by electromigration can be prevented. Further, parasitic resistance reduces, so that electrical properties are improved. In addition, a contact surface area increases, so that joint reliability of the metal bump is improved. Accordingly, a semiconductor package employing the bump structure of the present invention is improved in the electrical properties of semiconductor chips and the reliability of the bump as well.

Figure 10:
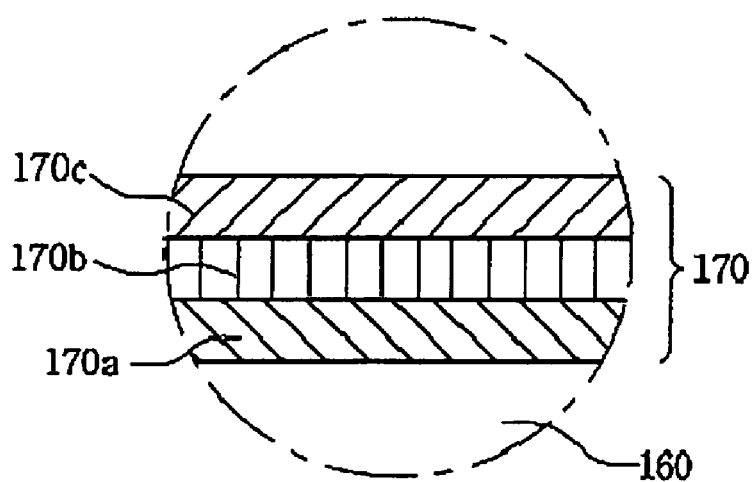
FIG. 10 is a magnified view of a portion A of FIG. 9.

The UBM 170 may be formed of a plurality of layers, as illustrated in FIG. 10. In an example, as illustrated in FIG. 10, the UBM 170 includes three layers: an undermost adhesion layer 170a improving an adhesive strength with the electrode pad or the redistribution electrode pad, a middle diffusion-barrier layer 170b preventing diffusion from the metal bump to the electrode pad, and an uppermost wetting layer 170c improving wettability with the metal bump. Alternatively, the UBM 170 may have a structure of two layers, for instance the adhesion layer and the diffusion-barrier layer, the adhesion layer and the wetting layer, the diffusion-barrier layer and the wetting layer, and so on.

FIGS. 12 through 19 are sectional views illustrating the processing operations of a method of fabricating a bump for a semiconductor package according to an embodiment of the present invention.

Figure 12:
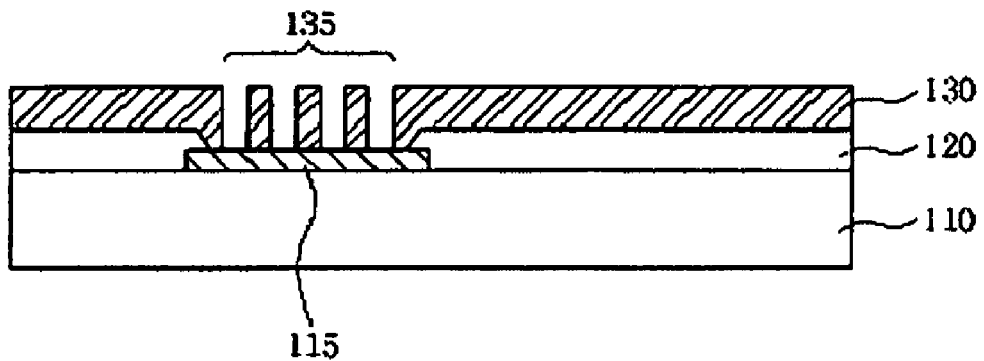
FIGS. 12 through 19 are sectional views illustrating a method of fabricating a metal bump for a semiconductor package in accordance with processing sequences according to an embodiment of the present invention.

As illustrated in FIG. 12, a first photosensitive polymer layer 130 is formed on an exposed chip pad 115 and a passivation layer 120, thereby to form a plurality of vias 135. The vias 135 may be formed, for instance, by a photoresist process using a mask where a via pattern is formed. Further, the polymer layer 130 may be formed using coating, immersion, or dry film deposition.

Figure 13:
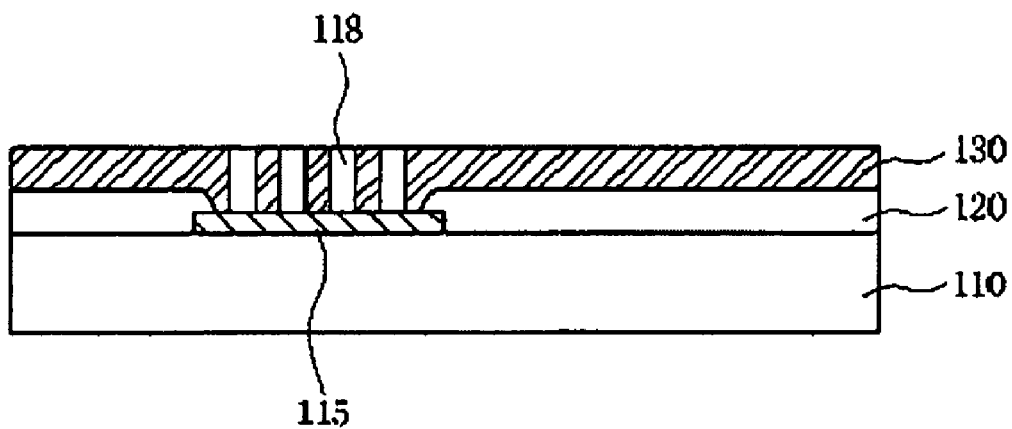

After the first polymer layer 130 is formed, an ashing process of removing the residue of the first polymer layer is carried out in order to improve the adhesive strength with a via filler. After the ashing process is completed, a metal layer is deposited to form a via filler 118. Then, photoresist is applied onto the metal layer, and only the desired portion of the photoresist is developed. An electroplating process is performed to fill the vias. Then, the photoresist is removed, and the UBM is etched. FIG. 13 illustrates the state in that the vias are filled with the filler 118.

Figure 14:
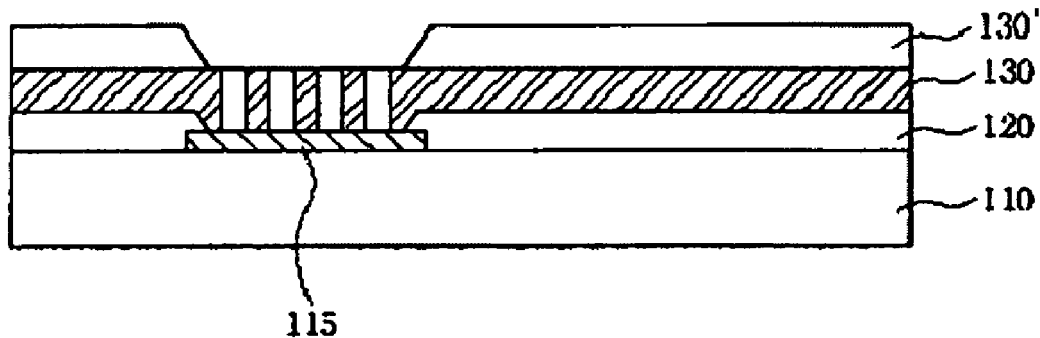
Figure 15:
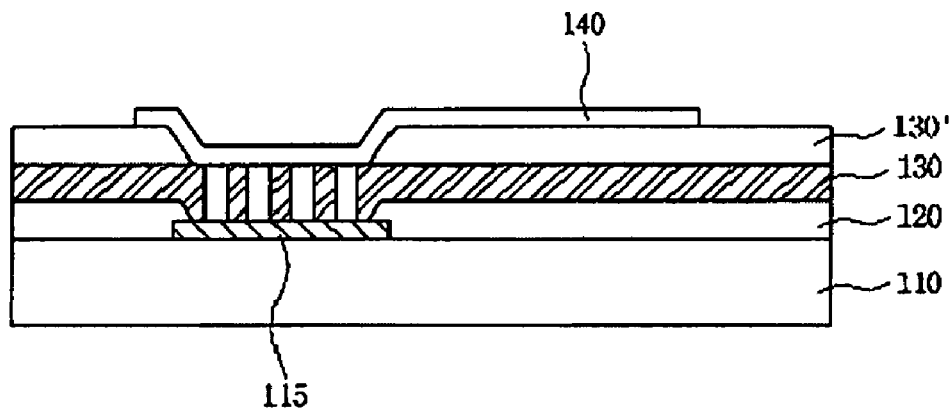

Next, as illustrated in FIG. 14, a second polymer layer 130' is formed to insulate neighboring pads, to secure a fine pitch, and to relieve stress of the bump. After the second polymer layer 130' is formed, an ashing process of removing the residue of the second polymer layer is carried out in order to improve the adhesive strength with an upper interconnection. Further, as illustrated in FIG. 15, a redistribution electrode layer 140 is formed on the second polymer layer 130' in order to electrically connect with the vias and form a redistribution pad in a planar array.

This redistribution electrode layer may be formed of at least one layer composed of a material having good adhesive strength with the second polymer layer 130' and excellent electrical conductivity, for instance, at least one of titanium, titanium alloy, chromium, chromium alloy, nickel, nickel alloy, copper, copper alloy, aluminum, aluminum alloy, gold, gold alloy, vanadium, and vanadium alloy.

When a pitch and a space between the neighboring pads are sufficiently ensured by the above process, the interconnection process of forming the electrode layer 140 may be performed by electroplating, electroless plating, and printing simultaneously during the process associated with the via filler 118. Further, the second polymer layer 130' may be omitted.

Figure 16:
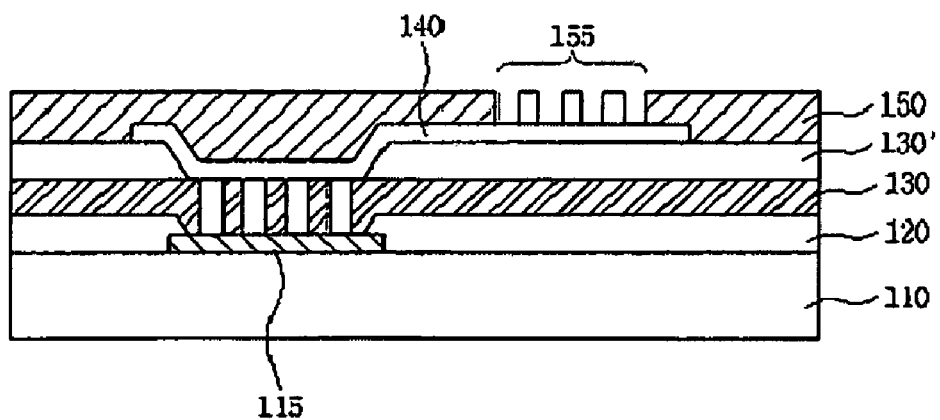

Then, as illustrated in FIG. 16, a third polymer layer 150 is formed on the redistribution electrode layer 140 in order to protect the interconnection and to provide electrical insulation. A plurality of vias 155 are format at a position where a bump of the third polymer layer 150 is formed. The vias 155 provide current dispersion effect by increasing the contact area of the metal bump contacting the UBM below the metal bump, and increasing the surface area of the interconnection.

Figure 17:
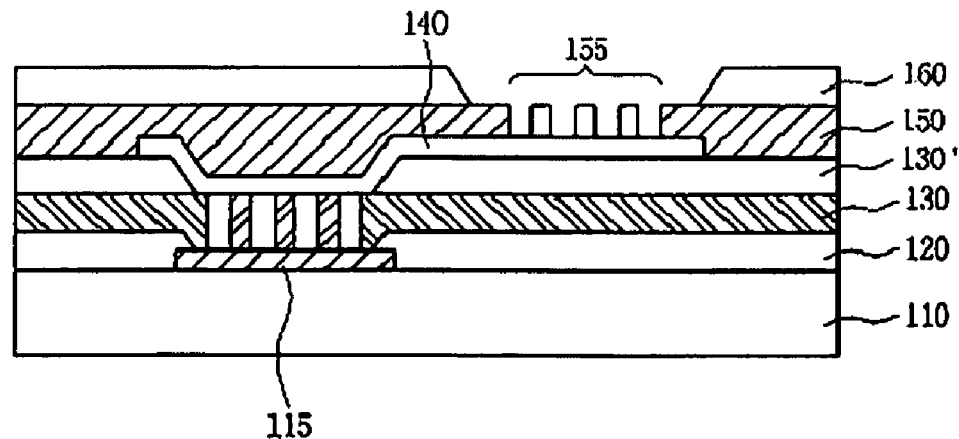

As illustrated in FIG. 17, a fourth polymer layer 160 is formed around the vias of the third polymer layer 150 in order to relieve stress. In the case of a fine pitch, the fourth polymer layer 160 may be applied and correspond to such a case by making the pattern size of the fourth polymer layer 160 smaller than that of the third polymer layer 150.

Figure 18:
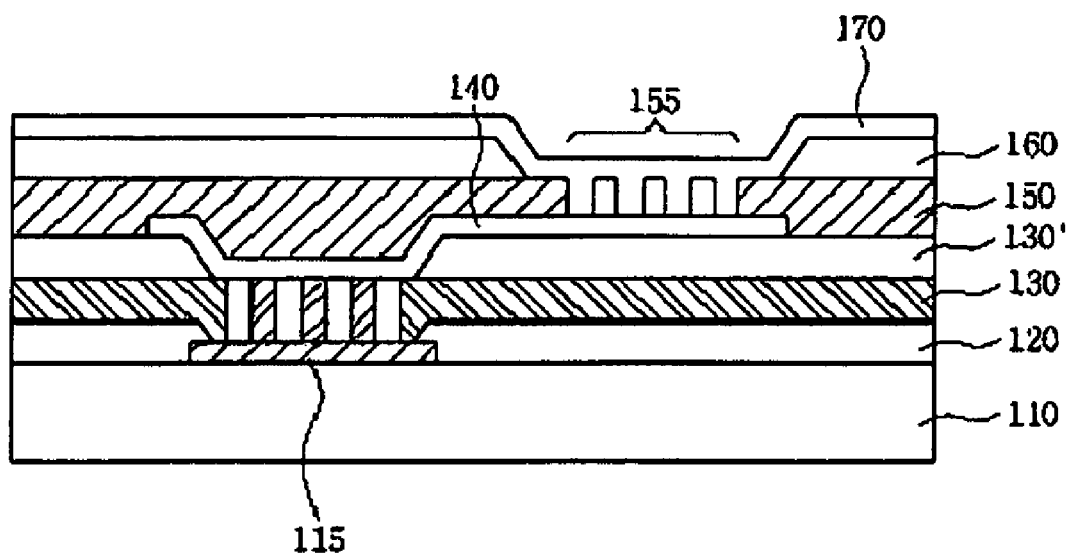

Then, as illustrated in FIG. 18, the UBM 170 is formed on the fourth polymer layer 160.

Figure 19:
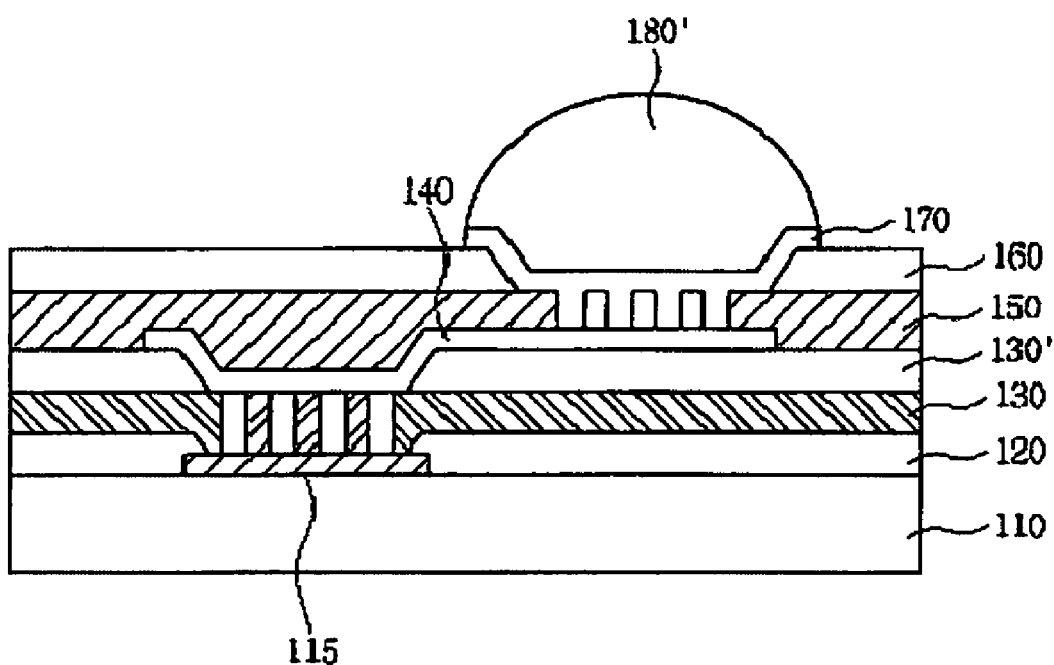

Then, a desired pattern is formed by applying photoresist on the UBM 170, and aligning a mask and a semiconductor wafer. Thus, a metal bump 180' is formed on the UBM 170, which is developed and exposed. The metal bump may be formed using an electroplating method, an electroless plating method, evaporation, ball attach, screen printing, or solder jet. Then, the photosensitive photoresist is removed. As illustrated in FIG. 19, the UBM 170 is etched using the bump 180' as a mask. At this time, the UBM 170 may be etched by wet etching using chemicals or dry etching using a physical method. The structure of the finally-formed bump is as illustrated in FIG. 9.

Thereafter, the metal bumps and electrode terminals of a printed circuit board are aligned to each other, and may be bonded by thermal compression. Further, by the underfill, which is applied between the semiconductor chip and the printed circuit board, joint reliability of the chip and the printed circuit board may be improved.

The first, second, third and fourth polymer layers 130, 130', 150 and 160 may be composed of photosensitive polymer such as polyimide, benzocyclobutene (BCB) and the like, and may preferably use a low-k dielectric insulating material (a dielectric constant of 3.8 or less) in order to relieve time delay during the high-frequency operation.

In the method of fabricating a semiconductor package according to an embodiment of the present invention, the bump has been described to be formed by the electroplating or electroless plating by way of example. However, the forming of the bump is not limited to the methods, and thus, it is apparent to those skilled in the art that the bump may be formed by Au stud bumping or stencil printing. The bump structure of the present invention can be variously modified by those skilled in the art without departing from the technical idea of the attached claims.

As described above, the bump for a semiconductor package according to embodiments of the present invention is characterized in that the polymer layer with a number of vias is formed on the electrode pad and/or the redistribution electrode pad of the semiconductor chip, which increases the surface area of the interconnection and lowers current density in the semiconductor device operating at high current/high frequency, thereby reducing interface crack caused by joule heating and atomic migration/electromigration. Further, the structure of the bump with the plural vias provides the advantage of improving electrical properties of the semiconductor chip by reducing parasite resistance and inductance components. In addition, with the bump for the semiconductor package according to the present invention, the contact area of the electrode pad, the metal bump, and the UBM increases by the presence of the polymer layer having a number of vias, thereby improving joint reliability.

The invention claimed is:

1. A semiconductor package comprising:
an electrode pad formed above a semiconductor chip;
a passivation layer disposed over the electrode pad and having an opening that exposes a portion of the electrode pad;
a first polymer layer directly formed on the passivation layer and the electrode pad, the first polymer layer having a first plurality of vias formed therethrough overlying the electrode pad;
a redistribution electrode layer having a first end and a second end, the redistribution electrode layer overlying the first polymer layer, the first end of the redistribution electrode layer being electrically connected to the electrode pad through the first plurality of vias,
a second polymer layer overlying the redistribution electrode layer, the second polymer layer having a second plurality of vias at the second end of the redistribution electrode layer;
an under bump metal formed on the second polymer layer and being electrically connected to the second end of the redistribution electrode layer through the second plurality of vias; and
a metal bump coupled to the under bump metal.

2. The semiconductor package according to claim 1, further comprising a stress relaxation layer formed above the second polymer layer.

3. The semiconductor package according to claim 1, wherein the metal bump is composed of at least one selected from the group consisting of gold, gold alloy, copper, copper alloy, nickel, nickel alloy, aluminum, aluminum alloy, silver, silver alloy, eutectic solder (Sn/37Pb), high lead solder (Sn/95Pb), and lead-free solder having Sn of 30% or more.

4. The semiconductor package according to claim 1, wherein the electrode pad of the semiconductor chip is composed of at least one selected from the group consisting of titanium, titanium alloy, aluminum, aluminum alloy, nickel, nickel alloy, copper, copper alloy, chromium, chromium alloy, gold, gold alloy, silver, sliver alloy, and lead-free solder containing tin (Sn).

5. The semiconductor package according to claim 1, wherein the under bump metal has a structure of at least one selected from an adhesion layer, a diffusion-barrier layer, and a wetting layer.

6. The semiconductor package according to claim 5, wherein the adhesion layer is composed of at least one selected from the group consisting of titanium, titanium alloy, chromium, chromium alloy, copper, copper alloy, nickel, nickel alloy, gold, gold alloy, aluminum, aluminum alloy, vanadium, and vanadium alloy.

7. The semiconductor package according to claim 5, wherein the diffusion-barrier layer is composed of at least one selected from the group consisting of nickel, nickel alloy, copper, copper alloy, vanadium, vanadium alloy, aluminum, aluminum alloy, gold, gold alloy, cobalt, cobalt alloy, manganese, and manganese alloy.

8. The semiconductor package according to claim 5, wherein the wetting layer is composed of at least one selected from the group consisting of copper, copper alloy, nickel, nickel alloy, gold, gold alloy, aluminum, aluminum alloy, cobalt, cobalt alloy, manganese, manganese alloy, and lead-free solder containing tin (Sn) of 30% of more.

9. The semiconductor package according to claim 5, wherein the adhesion layer has a thickness of about 0.01 μm to about 1 μm, and the diffusion-barrier layer has a thickness of about 1 μm to about 10 μm, and the wetting layer has a thickness of about 1 μm to about 10 μm, and the under bump metal has a thickness of about 0.1 μm to about 100 μm.

10. The semiconductor package according to claim 1, wherein the metal bump is formed inside and outside the vias of the second polymer layer.

11. The semiconductor package according to claim 1, wherein the first polymer layer is composed of at least one selected from polyimide, benzocyclobutene (BCB), epoxy resin, siloxane or silicone resin, and a mixture of organic and inorganic substances.

12. The semiconductor package according to claim 1, wherein the first polymer layer comprises an insulating material having a dielectric constant of 1.0 or more.

13. The semiconductor package according to claim 1, wherein the via of the first polymer layer has any one of a circular shape, a quadrangular shape, and a polygonal shape.

14. The semiconductor package according to claim 1, wherein the first polymer layer has a thickness of about 0.1 μm to about 100 μm, and a ratio of thickness to opening width of about 0.5 or more.

15. The semiconductor package according to claim 1, wherein a total area of the plurality of vias of the first polymer layer is 10% or more compared to that of the electrode pad, and a total surface area of the vias is 50% or more compared to that of the electrode pad.

16. The semiconductor package according to claim 1, wherein the semiconductor chip is composed of any one selected from silicon, glass, GaAs, SiGe, InP, GaAlAs, and InGaAlP.

17. A semiconductor package comprising:
   an electrode pad formed above a semiconductor chip;
   a passivation layer disposed over the electrode pad and having an opening that exposes a portion of the electrode pad;
   a first polymer layer directly formed on the passiviation layer and the electrode pad, the first polymer layer having a plurality of first vias formed therethrough, the plurality of first vias overlying the electrode pad;
   a redistribution electrode layer having a first end and a second end, the redistribution electrode layer directly formed on the first polymer layer, the first end of the redistribution electrode layer being electrically connected to the electrode pad through the plurality of first vias,
   a second polymer layer directly formed on the redistribution electrode layer, the second polymer layer having a plurality of second vias at the second end of the redistribution electrode layer,
   wherein the plurality of second vias expose portions of the second end of the redistribution electrode layer.

18. The semiconductor package of claim 17, further comprising
   an under bump metal formed on the second polymer layer and being electrically connected to the exposed portions of the second end of the redistribution electrode layer through the plurality of second vias.

19. The semiconductor package of claim 18, further comprising a conductive bump bonded to the under bump metal.

* * * * *